United States Patent [19]

Nizaka

[11] Patent Number: 5,325,323
[45] Date of Patent: Jun. 28, 1994

[54] ERASABLE AND PROGRAMMABLE ROM WITH AN IDENTIFICATION CODE

[75] Inventor: Minoru Nizaka, Tokyo, Japan

[73] Assignee: NEC Corporation, Tokyo, Japan

[21] Appl. No.: 762,385

[22] Filed: Sep. 19, 1991

[30] Foreign Application Priority Data

Sep. 20, 1990 [JP] Japan .................. 2-250858

[51] Int. Cl.⁵ .......................................... G11C 17/08
[52] U.S. Cl. ........................... 365/104; 365/96; 365/189.03; 365/230.05; 365/230.06; 365/225.7
[58] Field of Search ................ 365/230.01, 230.03, 365/230.05, 230.06, 49, 96, 104, 225.7, 189.03

[56] References Cited

U.S. PATENT DOCUMENTS 4,998,223  3/1991  Akaogi ........................ 365/230.03
5,111,431  5/1992  Garde .......................... 365/230.05
5,126,968  6/1992  Hamamoto et al. ......... 365/230.01

Primary Examiner—Joseph E. Clawson, Jr.
Attorney, Agent, or Firm—Leydig Voit & Mayer

[57] ABSTRACT

An erasable and programmable ROM with an identification code includes an internal circuit operating as an EPROM, a code reading circuit having a code setting circuit for storing a predetermined identification code, an output circuit, and a switching circuit for transferring an output of an internal circuit to the output circuit. The switching circuit is turned on to transfer the output signal of the internal circuit to the output circuit directly, when information in the internal circuit is read out. On the other hand, the switching circuit is turned off to separate the output circuit from the internal circuit, when the identification code is read out from the code setting circuit.

5 Claims, 3 Drawing Sheets

ERASABLE AND PROGRAMMABLE ROM WITH AN IDENTIFICATION CODE

FIELD OF THE INVENTION

This invention relates to an erasable and programmable ROM (EPROM), more particularly to an EPROM having an identification code corresponding to data such as a manufacturer thereof, product name, etc.

BACKGROUND OF THE INVENTION

A conventional EPROM with an identification code includes an internal circuit operating as a EPROM, a code setting circuit storing predetermined identification code, a switching circuit which is composed of plural logic gates and is connected at inputs to the internal circuit and the code setting circuit, and a control circuit for controlling the switching circuit to selectively supply one of outputs of the internal circuit and the code setting circuit to an output circuit.

In this conventional EPROM with an identification code, when a mode in which information stored in the internal circuit is read out is instructed by a selection signal of the control circuit, a signal from the internal circuit to the output circuit, and an identification code is not read from the code setting circuit. On the other hand, when a mode in which a predetermined identification code is read out is instructed, a signal from the code setting circuit is transferred through the switching circuit by disconnecting a signal line of the internal circuit.

According to the conventional EPROM with an identification code, however, there are disadvantages in that the switching circuit becomes complicated in structure and large in an occupying area, when the bit number of an identification code and/or functions of an EPROM are increased, because the switching circuit operates in accordance with levels of signals supplied from the control circuit and the code setting circuit. For this reason, the number of transistors which are arranged longitudinally in the switching circuit is increased. As a result, the transfer speed of a signal read from the internal circuit is lowered.

SUMMARY OF THE INVENTION

Accordingly, it is an object of the invention to provide an EPROM with an identification code which can be manufactured to be simple and compact.

It is another object of the invention to provide an EPROM with an identification code in which transfer speed of a signal supplied from an internal circuit is much increased.

According to the invention, an erasable and programmable ROM with an identification code comprises:

an internal circuit comprising memory cells for storing erasable and programmable information;

a code reading circuit comprising a code setting circuit for storing an identification code;

an output circuit for supplying information read from the internal circuit to an external circuit;

a switching circuit connected between the internal circuit and the output circuit to transfer the information from the internal circuit to the output circuit; and a control circuit for supplying control signals to the code reading circuit and the switching circuit, respectively;

wherein the switching circuit is turned off to separate the output circuit from the internal circuit, when the identification code is read out from the code setting circuit, whereby the identification code is supplied from the code setting circuit to the output circuit directly.

BRIEF DESCRIPTION OF THE DRAWINGS

The invention will be explained in more detail in conjunction with appended drawings; wherein.

DESCRIPTION OF THE PREFERRED EMBODIMENTS

Figure 1:
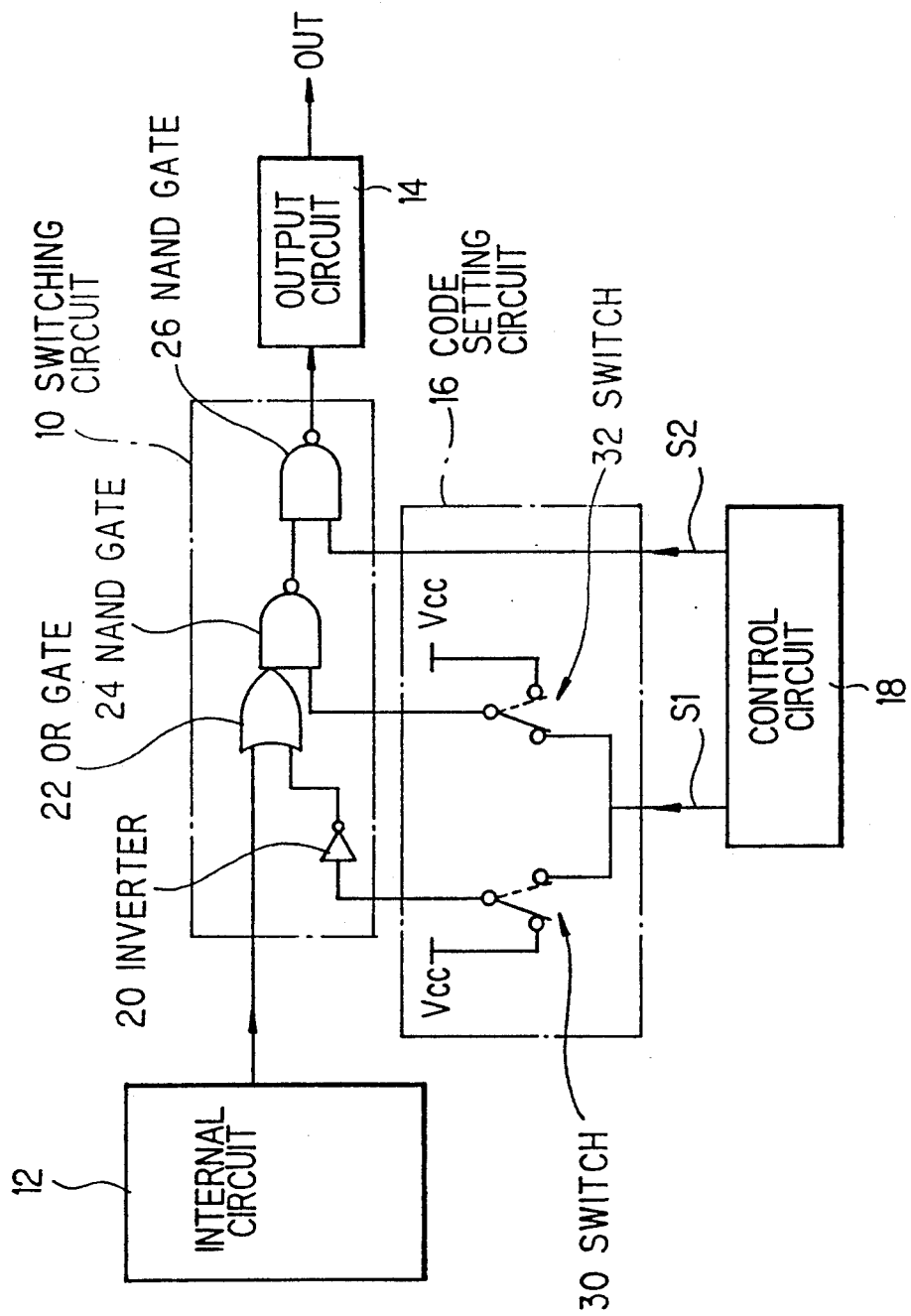
FIG. 1 is a circuit diagram showing a conventional EPROM with an identification code.

Before describing an EPROM with an identification code according to the invention, the conventional EPROM with an identification code briefly described before will be explained in conjunction with FIG. 1. The conventional EPROM with an identification code includes an internal circuit 12 which includes a memory cell (not shown) to operate as a ROM, an output circuit 14, a switching circuit 10 connected between the internal circuit 12 and the output circuit 14, a code setting circuit 16 connected at outputs to the switching circuit 10, and a control circuit 18 connected to the switching circuit 10 and the code setting circuit 16.

The switching circuit 10 includes an inverter 20, an OR gate 22 connected at inputs to the internal circuit 12 and the inverter 20, a NAND gate 24 connected at one of inputs to an output of the OR gate 22, and a NAND gate 26 connected at inputs to an output of the NAND gate 24 and the control circuit 18 and at an output to the output circuit 14.

The code setting circuit 16 includes a first identification code setting switch 30 connected at a common terminal to an input of the inverter 20, at a first selection terminal to a power supply Vcc and at a second selection terminal to a first output of the control circuit 18, and a second identification code setting switch 32 connected at a common terminal to another input of the NAND gate 24, at a first selection terminal to the first output of the control circuit 18, and at a second selection terminal to another power supply Vcc.

In this code setting circuit 16, the first switch 30 is turned on the first selection terminal connected to the power supply Vcc, and the second switch 32 is turned on the first selection terminal connected to the control circuit 18 as shown in FIG. 1.

In operation, a mode in which information stored in the internal circuit 12 is read out is set, when selection signals S1 and S2 of high level are supplied from the control circuit 18 to the inputs of the NAND gates 24 (through the second switch 32) and 26. Therefore, an output level of the switching circuit 10 depends on an output signal of the internal circuit 12.

A mode in which an identification code is read is set, when one of the selection signals S1 and S2 is low. At first, when the selection signal S2 of low level is supplied from the control circuit 18 to the NAND gate 26, and the selection signal S1 of high level is supplied therefrom to the second switch 32, a signal of high level is supplied from the switching circuit 10 to the output circuit 14 in accordance with the below truth table.

| S1 | S2 | INVERTER 20 | OR 22 | NAND 24 | NAND 26 | OUTPUT 14 |
|----|----|----|----|----|----|----|
| 1  | 0  | 0  | 0  | 1  | 1  | 1  |

Next, the selection signal S1 of low level is supplied from the control circuit 18 to the second switch 32, and the selection signal S2 of high level is supplied therefrom to the NAND gate 26. At this time, a low level signal is supplied from the switching circuit 10 to the output circuit 14 in accordance with the below truth table.

| S1 | S2 | INVERTER 20 | OR 22 | NAND 24 | NAND 26 | OUTPUT 14 |
|----|----|----|----|----|----|----|
| 0  | 1  | 0  | 0  | 1  | 0  | 0  |

In this manner, an identification code "1 0" is read out of the code setting circuit 16 by adding the selection signals S1 and S2 of "1 0" and "0 1" sequentially to the code setting circuit 16 and the switching circuit 10. In a practical use, the identification code is usually of eight bits.

In general, when the internal circuit 12 is required to be modified in function a wiring arrangement of the EPROM is modified. For this purpose, the switches 30 and 32 are formed as shown by dotted lines, respectively. That is, the switch 30 connects the inverter 20 to the control circuit 18 and the switch 32 connects the NAND gate 24 to the power supply Vcc. In this condition, when the selection signal S1 is of low level, and the selection signal S2 is of high level, output level of the NAND gate 24 becomes high. Therefore, a signal of high level is supplied from the switching circuit 10 to the control circuit 14. On the other hand, when the selection signals S1 and S2 are high and low, respectively, an output signal of high level is obtained. Thus, an identification code "1 1" is read out of the code setting circuit.

According to the conventional EPROM with an identification code, however, there are disadvantages in that transfer speed of the internal circuit 12 is slow and structure of the switching circuit 10 is complicated and large, when the bit number of the identification code is increased as described before.

Figure 2:
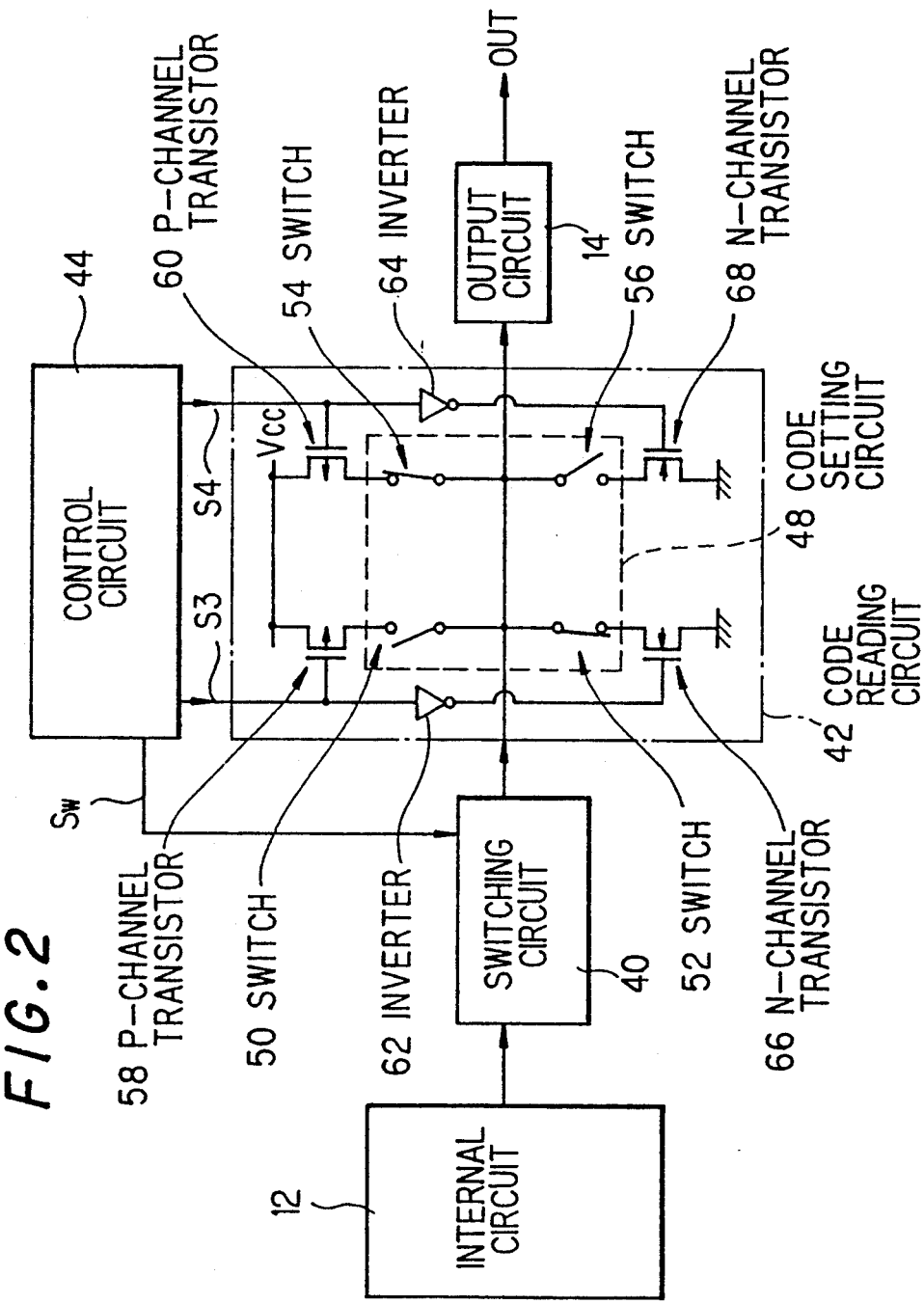
FIG. 2 is a circuit diagram showing an EPROM with an identification code of a first preferred embodiment according to the invention.

Next, an EPROM with an identification code of a first preferred embodiment according to the invention will be explained in conjunction with FIG. 2. The EPROM includes an internal circuit 12 which includes memory cells (not shown) to operate as a ROM, an output circuit 14, a switching circuit 40 connected to an output of the internal circuit 12, a code reading circuit 42 connected between an output of the switching circuit 40 and an input of the output circuit 14, and a control circuit 44 connected to the switching circuit 40 and the code reading circuit 42.

A part of the code reading circuit 42 provides a code setting circuit 48 including four switches 50, 52, 54 and 56. The switches 50 and 52 and the switches 54 and 56 are respectively connected in series, and nodes between the switches 50 and 52 and the switches 54 and 56 are connected to a signal line between the output of the switching circuit 40 and the input of the output circuit 14, respectively. The remaining portion of the code reading circuit 42 includes two P-channel transistors 58 and 60 each connected at a gate to the control circuit 44, at a source to a power supply Vcc and at a drain to the switch 50 and 54, correspondingly, two inverters 62 and 64 each connected at an input to the control circuit 44, and two N-channel transistors 62 and 64 each connected at a gate to an output of the inverter 62 and 64, at a source to the switch 52 and 56 and at a drain to ground, correspondingly. In each pair of switches 50 and 52 and 54 and 56, the switching states are different, that is, when one is ON state, the other is OFF state, as shown therein.

In operation, when a mode in which information stored in the internal circuit 12 is read out is instructed, a switching signal Sw of high level and selection signals S3 and S4 of high level are supplied from the control circuit 44 to the switching circuit 40 and the code reading circuit 42, correspondingly. Then, the switching circuit 40 is turned on to provide a signal transfer state, and each of the transistors 58, 60, 66 and 68 becomes OFF state, so that an output signal of the internal circuit 12 is transferred through the switching circuit 40 to the output circuit 14.

When a mode in which identification code is read out is instructed, the switching signal Sw of low level is supplied from the control circuit 44 to the switching circuit 40, so that the switching circuit 40 becomes OFF state. As the result, the internal circuit 12 is separated from the output circuit 14. Next, when the select signal S4 of low level and the select signal S3 of high level are supplied to the code reading circuit 42, the transistors 60 and 68 become ON state and the transistors 58 and 66 become OFF state. Therefore, a high level signal is supplied from the code reading circuit 42 to the output circuit 14. On the other hand, when the selection signal S4 of high level and the selection signal S3 of low level are supplied to the code reading circuit 42, the transistors 60 and 68 become OFF state and the transistors 58 and 66 become ON state. Therefore, a low level signal is supplied to the output circuit 14.

This identification code reading operation is shown by the below table.

| SELECTION SIGNAL | | TRANSISTOR | | | | OUTPUT |
|---|---|---|---|---|---|---|
| S3 | S4 | 58 | 60 | 66 | 68 | 14 |
| 1 | 0 | OFF | ON | OFF | ON | 1 |
| 0 | 1 | ON | OFF | ON | OFF | 0 |

Figure 3:
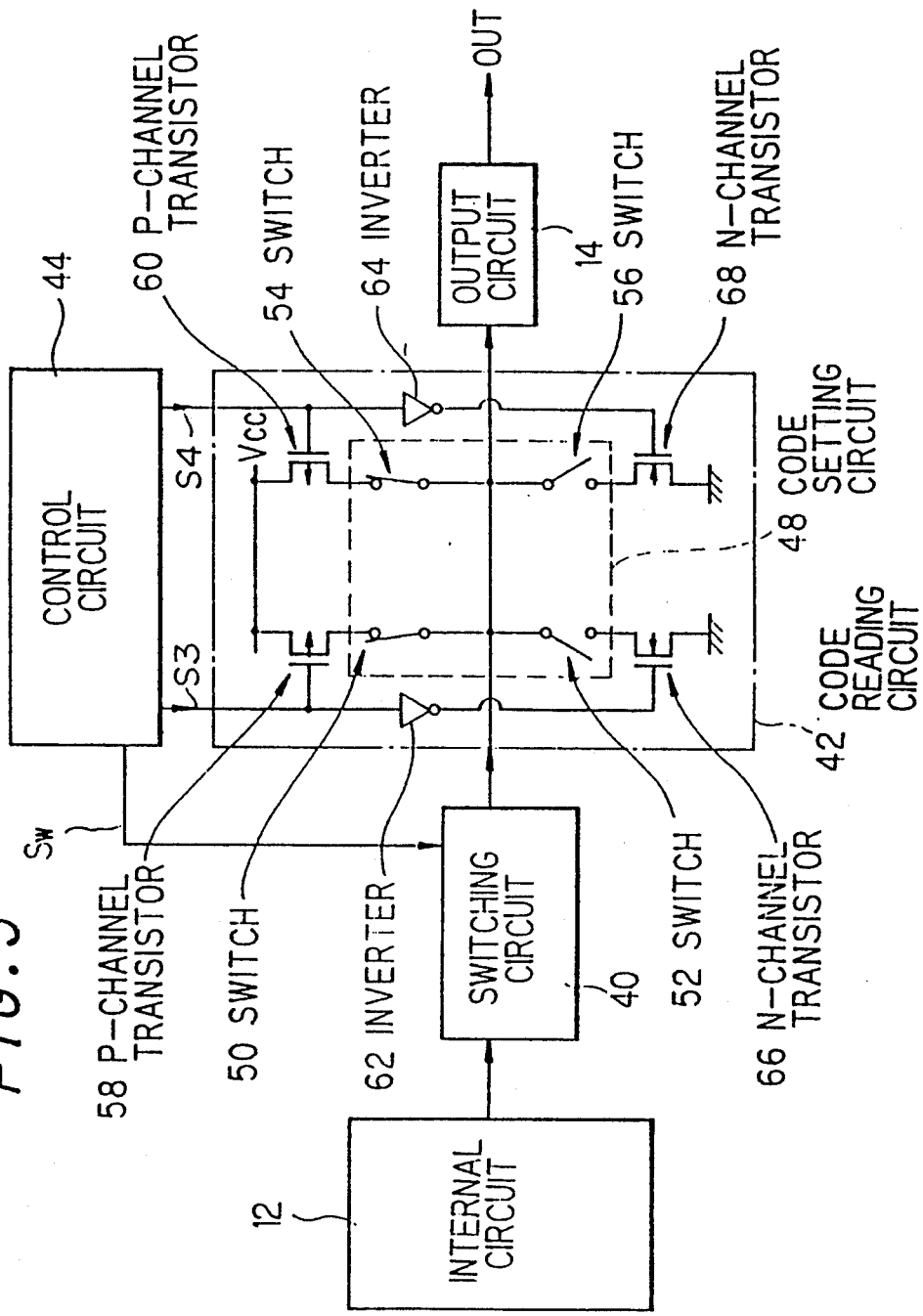
FIG. 3 is a circuit diagram showing an EPROM with an identification code of a second preferred embodiment according to the invention.

An EPROM with an identification code of a second preferred embodiment according to the invention will be explained in conjunction with FIG. 3, wherein like parts are indicated by like reference numerals and symbols. The difference can be found between the first and second preferred embodiments in that the switches 50 and 54 are at ON state, and the switches 52 and 56 are at OFF state in the second preferred embodiment.

An identification code which is determined by this switching pattern is read out in accordance with the below truth table.

| SELECTION SIGNAL | | TRANSISTOR | | | | OUTPUT |
|---|---|---|---|---|---|---|
| S3 | S4 | 58 | 60 | 66 | 68 | 14 |
| 1 | 0 | OFF | ON | OFF | ON | 1 |
| 0 | 1 | ON | OFF | ON | OFF | 1 |

An apparent from the above preferred embodiments, the following truth table are obtained.

When the switches 50 and 54 are at OFF state, and the switches 52 and 56 are at ON state,

| SELECTION SIGNAL | | TRANSISTOR | | | | OUTPUT |
|---|---|---|---|---|---|---|
| S3 | S4 | 58 | 60 | 66 | 68 | 14 |
| 1 | 0 | OFF | ON | OFF | ON | 0 |
| 0 | 1 | ON | OFF | ON | OFF | 0 |

When the switches 50 and 56 are at ON state, and the switches 52 and 54 are at OFF state,

| SELECTION SIGNAL | | TRANSISTOR | | | | OUTPUT |
|---|---|---|---|---|---|---|
| S3 | S4 | 58 | 60 | 66 | 68 | 14 |
| 1 | 0 | OFF | ON | OFF | ON | 0 |
| 0 | 1 | ON | OFF | ON | OFF | 1 |

According to the preferred embodiments, the EPROM can be manufactured to be simple and compact, and transfer speed of signal from the internal circuit 12 can be increased independently of the bit number of an identification code, because an output of the EPROM is controlled by the switching circuit 40. In more detail, when information in the internal circuit 12 is ordinarily read out, an output signal of the internal circuit 12 is transferred from the switching circuit 40 directly to the output circuit 14. On the other hand, when a predetermined identification code is read out, the internal circuit 12 is completely separated from the output circuit 14 by the switching circuit 40.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A read only memory comprising:
   an internal circuit including memory cells for storing data;
   an output line;
   a switching circuit connected between the internal circuit and the output line, selectively connecting the output line to the internal circuit;
   an identification code reading circuit connected to the output line, including a series connection of a first switch and a first transistor connected between the output line and a potential source, the identification code reading circuit for selectively outputting an identification code to the output line when the switching circuit has disconnected the output line from the internal circuit, wherein the first transistor and the first switch are connected to a high potential source, and wherein the identification code reading circuit includes a second transistor and a second switch serially connected between the output line and a low potential source, wherein the identification code is set by the first and second switch and wherein outputting of the identification code is controlled using respective control terminals of the first and second transistors.

2. An erasable and programmable ROM with an identification code comprising:
   an internal circuit including memory cells for storing erasable and programmable information;
   an output line;
   a switching circuit connected between the internal circuit and the output line, for selectively connecting the output line to the internal circuit;
   a code reading circuit including a code setting circuit, wherein the code setting circuit is selectively connectable to high and low potential sources, connected to the output line, stores the identification code, and includes first and second switches having first ends connected to the output line for setting the identification code; and
   a control circuit for controlling the switching circuit and the code reading circuit to operate in information and code reading modes, wherein:
   the information mode includes the switching circuit connecting the internal circuit to the output line for transferring data from the internal circuit to the output line, and the code reading circuit disconnecting the code setting circuit from the high and low potential sources, and
   the code reading mode includes the switching circuit disconnecting the internal circuit from the output line, and the code reading circuit connecting the code setting circuit to the high and low potential sources, the high and low potential sources being selectively connected to the output line responsive to the identification code, wherein the code reading circuit includes first and second transistors, the first transistor connected between the high potential source and a second end of the first switch, the second transistor connected between the low potential source and a second end of the second switch, the first and second transistors including control terminals coupled to the control circuit.

3. The ROM as claimed in claim 2 wherein the code setting circuit includes third and fourth switches having first ends connected to the output line, for setting the identification code.

4. The ROM as claimed in claim 3 wherein the code reading circuit includes third and fourth transistors, the third transistor connected between the high potential source and a second end of the third switch, the fourth transistor connected between the low potential source and a second end of the fourth switch, the third and fourth transistors including control terminals coupled to the control circuit.

5. The ROM as claimed in claim 4 wherein either the first switch or the second switch is open and wherein either the third switch or the fourth switch is open.

* * * * *